United States Patent
Jung et al.

(10) Patent No.: US 7,334,137 B2
(45) Date of Patent: Feb. 19, 2008

(54) MEMORY INTERFACE SYSTEMS THAT COUPLE A MEMORY TO A MEMORY CONTROLLER AND ARE RESPONSIVE TO A TERMINAL VOLTAGE THAT IS INDEPENDENT OF SUPPLY VOLTAGES FOR THE MEMORY AND THE MEMORY CONTROLLER

(75) Inventors: Tae-sung Jung, Seoul (KR); Byung-se So, Kyungki-do (KR); Myun-joo Park, Incheon (KR)

(73) Assignee: Samsung Electronics Co., Ltd. (KR)

( * ) Notice: Subject to any disclaimer, the term of this patent is extended or adjusted under 35 U.S.C. 154(b) by 472 days.

(21) Appl. No.: 09/851,277

(22) Filed: May 8, 2001

(65) Prior Publication Data

US 2001/0042216 A1    Nov. 15, 2001

(30) Foreign Application Priority Data

May 8, 2000    (KR)    ................................ 2000-24437

(51) Int. Cl.
*G06F 1/00*    (2006.01)
*G11C 7/00*    (2006.01)
*G11C 7/02*    (2006.01)
*H02J 1/10*    (2006.01)
*H02J 1/00*    (2006.01)

(52) U.S. Cl. ................. 713/300; 365/226; 365/189.11; 365/189.07; 307/28; 307/72; 307/74; 307/75

(58) Field of Classification Search ................ 365/226, 365/189.11, 189.07; 307/28, 72, 74, 75; 713/300

See application file for complete search history.

(56) References Cited

U.S. PATENT DOCUMENTS

| | | | | |
|---|---|---|---|---|
| 5,262,868 A | * | 11/1993 | Kaneko et al. | .......... 348/231.9 |
| 5,438,281 A | * | 8/1995 | Takahashi et al. | ............. 326/86 |
| 5,450,365 A | * | 9/1995 | Adachi | ........................ 365/226 |
| 5,910,920 A | * | 6/1999 | Keeth | .................... 365/189.05 |
| 6,078,978 A | * | 6/2000 | Suh | ............................. 710/305 |
| 6,140,841 A | * | 10/2000 | Suh | ............................. 326/60 |
| 6,184,737 B1 | * | 2/2001 | Taguchi | ...................... 327/319 |
| 6,185,145 B1 | * | 2/2001 | Merritt | ....................... 365/226 |
| 6,265,893 B1 | * | 7/2001 | Bates | .......................... 326/30 |
| 6,701,446 B2 | * | 3/2004 | Tsern et al. | ................. 713/501 |

FOREIGN PATENT DOCUMENTS

| | | | |
|---|---|---|---|
| JP | 4-271673 | * | 2/1991 |
| JP | 4061690 | | 2/1992 |
| JP | 4281542 | | 10/1992 |

* cited by examiner

OTHER PUBLICATIONS www.wikipedia.com=>"Operational amplifier".*

*Primary Examiner*—Fritz Flemming
*Assistant Examiner*—Alan S. Chen
(74) *Attorney, Agent, or Firm*—Myers, Bigel, Sibley & Sajovec, P.A.

(57) ABSTRACT

Memory interface systems include one or more channel lines that couple a memory to a memory controller such that the channel line(s) are responsive to a terminal voltage that is independent of supply voltages for the memory and the memory controller. Because the memory interface system uses a terminal voltage that is independent of the supply voltages of the memory and the memory controller, the interface system may be unaffected by voltage differences between the memory supply voltage and the memory controller supply voltage.

16 Claims, 3 Drawing Sheets

… (1)

MEMORY INTERFACE SYSTEMS THAT COUPLE A MEMORY TO A MEMORY CONTROLLER AND ARE RESPONSIVE TO A TERMINAL VOLTAGE THAT IS INDEPENDENT OF SUPPLY VOLTAGES FOR THE MEMORY AND THE MEMORY CONTROLLER

RELATED APPLICATION

This application claims the benefit of Korean Patent Application No. 00-24437, filed May 8, 2000, the disclosure of which is hereby incorporated herein by reference.

FIELD OF THE INVENTION

The present invention relates generally to semiconductor memory devices and, more particularly, to interface systems between semiconductor memory devices and memory controller devices.

BACKGROUND OF THE INVENTION

Integration densities and clock speeds of semiconductor circuits are generally increasing. To facilitate the increase in density and clock speed, device sizes, line widths, and/or operating voltages may be reduced. Reductions in line widths and/or operating voltages may vary between integrated circuits based on the application and/or product in which the integrated circuit is used. Generally, new manufacturing processes that may achieve finer line widths and lower operating voltages for a circuit have been developed first for central processing units (CPUs) for a computer and related chip sets. Manufacturing technology that may achieve finer line widths and lower operating voltages for semiconductor memory devices has generally developed more slowly than that for CPUs. As a result, a computer system may comprise a CPU and related circuitry that operate at a different voltage than a memory device. The difference in operating voltages between a CPU and a memory device may be a source of problems in a computer system.

Input/output operations in a general-purpose computer system may be performed by transmitting data between a memory and a memory. It is generally preferable to use a uniform operating voltage for both the memory and the memory controller to improve performance of the system. Typically, however, the memory controller operates using a lower supply voltage than the memory. Unfortunately, additional costs may be incurred in the manufacturing process to lower the operating voltage of the memory to that used by the memory controller.

SUMMARY OF THE INVENTION

According to embodiments of the present invention, a memory interface system comprises one or more channel lines that couple a memory to a memory controller such that the channel line(s) are responsive to a terminal voltage that is independent of supply voltages for the memory and the memory controller. Because the memory interface system uses a terminal voltage that is independent of the supply voltages of the memory and the memory controller, the interface system may be unaffected by voltage differences between the memory supply voltage and the memory controller supply voltage.

In accordance with further embodiments of the present invention, the memory comprises a first transmitter and a first receiver, and the memory controller comprises a second transmitter and a second receiver. The first and second receivers may comprise first and second differential amplifier circuits, respectively, and the first and second transmitters may comprise first and second open-drain MOS transistors, respectively. A first channel line couples the first transmitter to the second receiver and a second channel line couples the second transmitter to the first receiver.

In accordance with still further embodiments of the present invention, the first and second receivers are powered by the memory supply voltage and the memory controller supply voltage, respectively. The first and second transmitters, however, are operable independent of the memory supply voltage and the memory controller supply voltage, respectively.

In accordance with further embodiments of the present invention, the magnitude of the terminal voltage is greater than the respective magnitudes of the memory supply voltage and the memory controller supply voltage. By increasing the magnitude of the terminal voltage relative to the supply voltages of the memory and the memory controller, the signal to noise ratio of the memory interface system may be improved. To reduce voltage stress on the first and second receivers should the magnitude of the terminal voltage exceed the design tolerances of the first and/or second receivers, first and second level shifters may be used to couple the second channel line to the first receiver and the first channel line to the second receiver, respectively. The level shifters may level shift the logic "1" voltage levels on the first and second channel lines to levels suitable for the first and second receivers.

Because the supply voltages of a memory and a memory controller are electrically independent from each other and are also electrically independent from a terminal voltage, a computer system comprising the memory and the memory controller may be designed with fewer restrictions in setting supply voltages. Moreover, because the voltages that power the transmitters and receivers of the memory and the memory controller need not be uniformly adjusted, manufacturing costs may be reduced.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
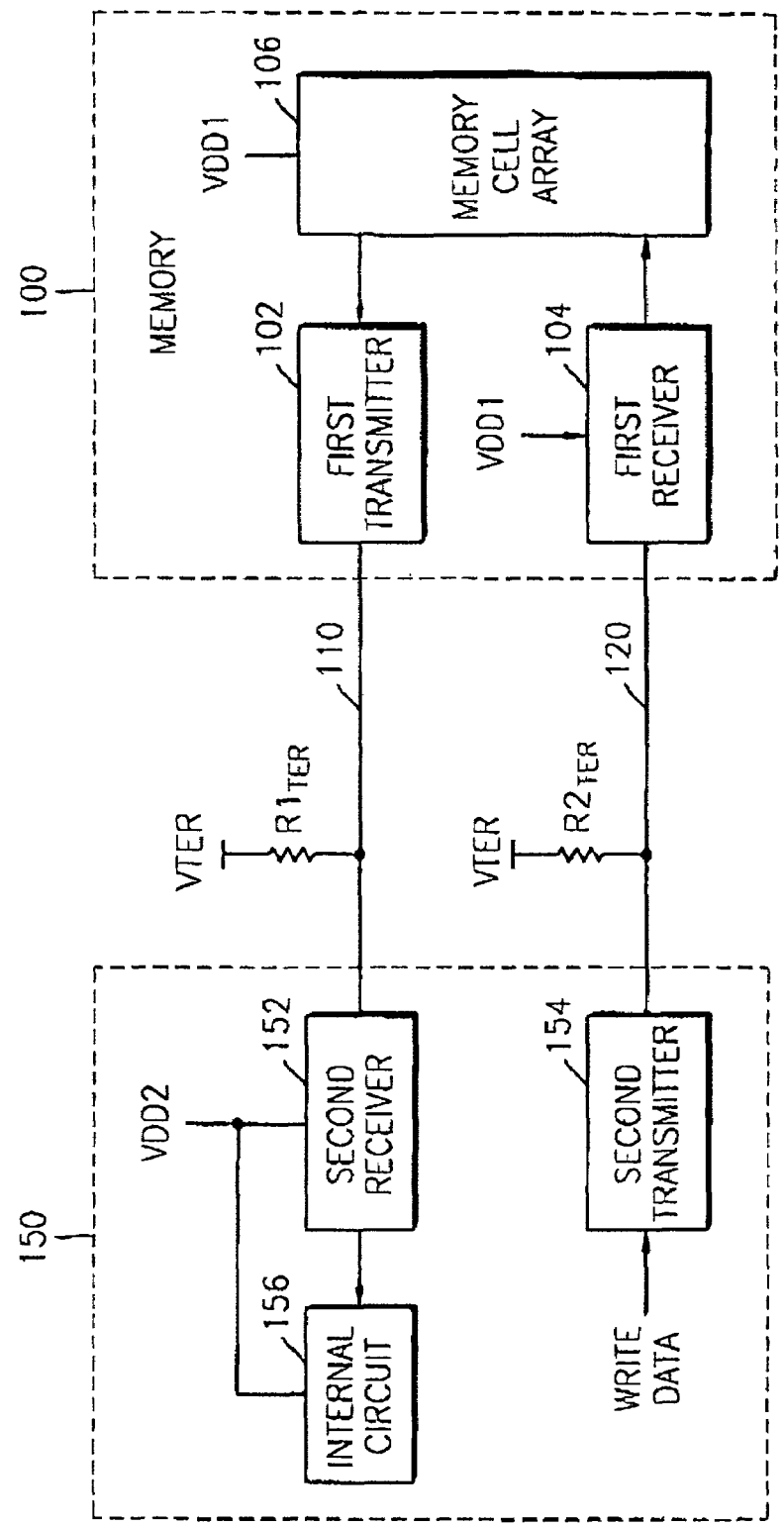
FIGS. 1-3 are circuit schematics that illustrate memory interface systems in accordance with various embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 illustrates a memory interface system in accordance with embodiments of the present invention. A memory 100 is coupled to a memory controller 150 by channel lines 110 and 120, which are respectively responsive to a terminal voltage VTER that is independent of a memory supply voltage VDD1 and/or a memory controller supply voltage VDD2. Channel line 110 couples a first transmitter 102 in the memory 100 to a second receiver 152 in the memory controller 150. Similarly, channel line 120 couples a second transmitter 154 in the memory controller 150 to a first receiver 104 in the memory 100.

The terminal voltage VTER may be supplied from an external voltage source and may be set at a predetermined level. The level of the terminal voltage VTER is independent of the memory supply voltage VDD1 and/or the memory controller supply voltage VDD2. Preferably, the magnitude of the terminal voltage VTER is greater than the respective magnitudes of the memory supply voltage VDD1 and the memory controller supply voltage VDD2. As shown in FIG. 1, the terminal voltage VTER is applied to the transmitters and receivers of the memory 100 and the memory controller 150 through terminal resistors $R1_{TER}$ and $R2_{TER}$, and the channel lines 110 and 120. In other embodiments of the present invention, separate terminal voltages may be applied through the respective channel lines 110 and 120.

The memory 100 comprises the first transmitter 102, the first receiver 104, and a memory cell array 106. The memory 100 writes and reads data to the memory cell array 106, which is responsive to the memory supply voltage VDD1. The first transmitter 102 and the first receiver 104 transmit and receive data, respectively, responsive to the terminal voltage VTER. The first transmitter 102, which is coupled to the terminal voltage VTER through the channel line 110 and the terminal resistor $R1_{TER}$, controls the transmission of data output from the memory cell array 106 through the channel line 110 to destinations external to the memory 100. The first receiver 104, which is responsive to the memory supply voltage VDD1, controls the receipt of data through the channel line 120 from sources external to the memory 100. The memory cell array 106 comprises a plurality of memory cells and stores and outputs data. The memory 100 may be embodied, for example, as a dynamic random access memory (DRAM) device or as another type of memory device.

The memory controller 150, controls various operations, including the reading and writing of data from and to the memory 100. The memory controller 150 comprises a second receiver 152 and an internal circuit 156, which are responsive to the memory controller supply voltage VDD2. For purposes of illustration it may be assumed that the memory controller supply voltage VDD2 is not equal to the memory supply voltage VDD1. Nevertheless, in other embodiments, the memory controller supply voltage VDD2 and the memory supply voltage VDD1 may be equal to each other. The memory controller 150 may comprise additional circuits, which are not explicitly shown, but are represented as the internal circuit 156. The second transmitter 154, which is coupled to the terminal voltage VTER through the channel line 120 and the terminal resistor $R2_{TER}$, controls the transmission of data from the memory controller 150 through the channel line 120 to the memory 100. The data supplied to the second transmitter 154 may be viewed as data to be written to the memory 100. The second receiver 152, which is responsive to the memory controller supply voltage VDD2, controls the receipt of data through the channel line 110 from the memory 100. The data received from the memory 100 may be stored in a cache memory (not shown) or another block in the memory controller 150.

The channel line 110 is a path over which the first transmitter 102 transmits data from the memory 100 to the second receiver 152 of the memory controller 150. Similarly, the channel line 120 is a path over which the second transmitter 154 transmits data from the memory controller 150 to the first receiver 104 of the memory 100. The channel lines 110 and 120 are coupled to the terminal voltage VTER via resistors $R1_{TER}$ and $R2_{TER}$, respectively.

Figure 2:
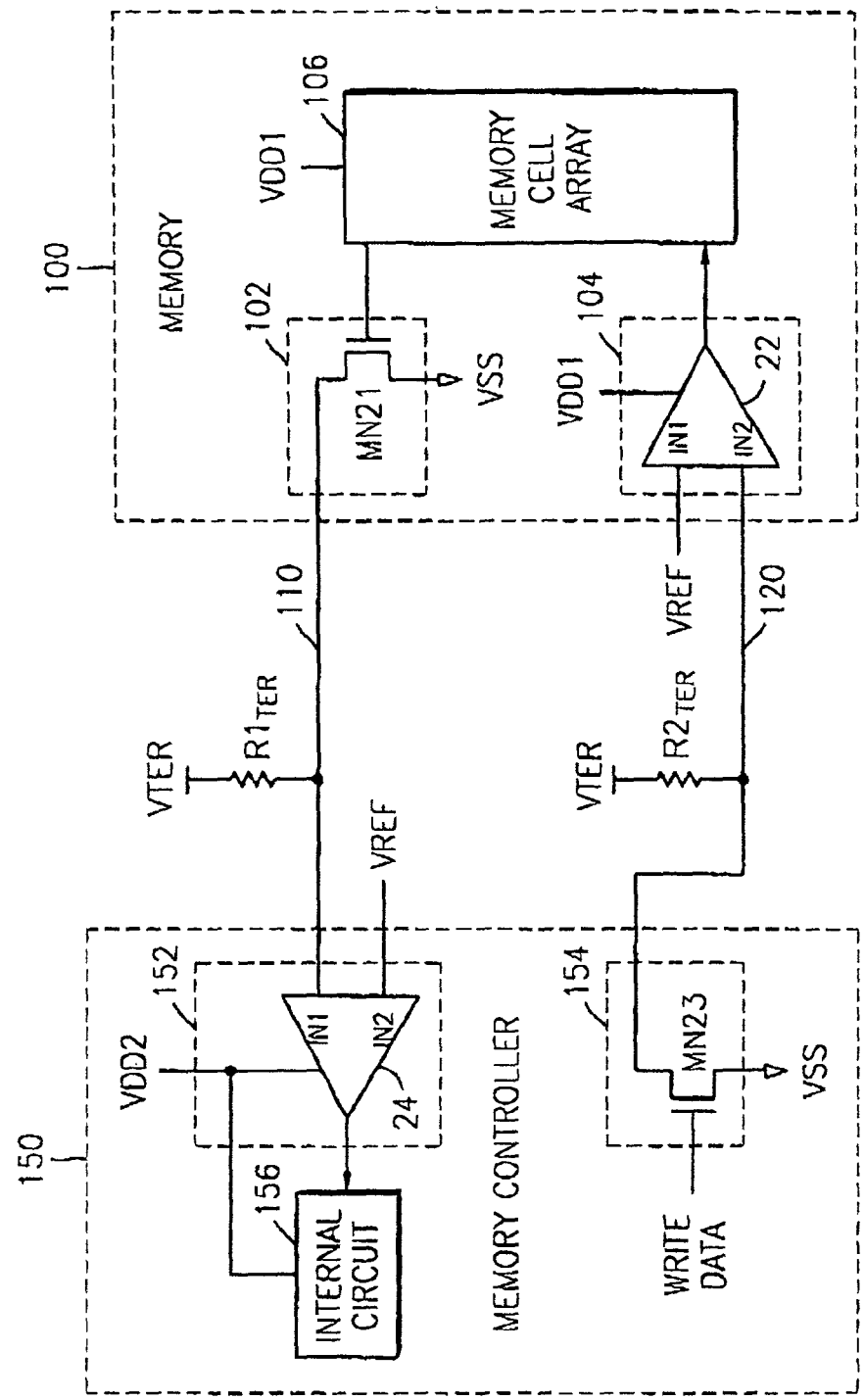

FIG. 2 illustrates a memory interface system in accordance with further embodiments of the present invention. As shown in FIG. 2, the first transmitter 102 is embodied as a switch that is responsive to data that is read from the memory cell array 106. In particular embodiments of the present invention, the first transmitter 102 may be embodied as an NMOS transistor MN21. Although the first transmitter 102 is illustrated as a single NMOS transistor MN21, it will be understood that the first transmitter 102 may be embodied as one or more transistors. A gate terminal of the NMOS transistor MN21 is connected to the memory cell array 106 and is responsive to data that is output therefrom. A source terminal of the NMOS transistor MN21 is connected to a ground reference voltage (VSS) and a drain terminal of the NMOS transistor MN21 is connected to the channel line 110. The transistor MN21 may be embodied as an open-drain type transistor, which may electrically isolate the first transmitter 102 from the memory supply voltage VDD1.

Still referring to FIG. 2, the first receiver 104 may be embodied as a differential amplifier 22 that determines the data received on the channel line 120 based on a difference between the data signal on the channel line 120 and a reference signal VREF, which are received on input terminals IN2 and IN1, respectively. The differential amplifier 22 operates responsive to the memory supply voltage VDD1 and senses whether a signal transmitted on the channel line 120 is a logic "0" or a logic "1" by amplifying a difference between the reference voltage VREF and the signal voltage on the channel line 120. The sensed result is output as data that may be written to the memory cell array 106. In other embodiments of the present invention, the first receiver 104 may be another type of structural input buffer.

The second receiver 152 may be embodied as a differential amplifier 24 that determines the data received on the channel line 110 based on the difference between the data signal on the channel line 110 and the reference signal VREF, which are received on input terminals IN1 and IN2, respectively. The differential amplifier 24 operates responsive to the memory controller supply voltage VDD2 and senses whether a signal transmitted on the channel line 110 is a logic "0" or a logic "1" by amplifying a difference between the reference voltage VREF and the signal voltage on the channel line 110. The sensed result is output as data that may be written to the internal circuit 156. In other embodiments of the present invention, the second receiver 152 may be another type of structural input buffer.

Still referring to FIG. 2, the second transmitter 154 is embodied as a switch that is responsive to write data supplied by the memory controller 150. In particular embodiments of the present invention, the second transmitter 154 may be embodied as an NMOS transistor MN23. Although the second transmitter 154 is illustrated as a single NMOS transistor MN23, it will be understood that the second transmitter 154 may be embodied as one or more transistors. A gate terminal of the NMOS transistor MN23 is responsive to write data that is supplied thereto. A source terminal of the NMOS transistor MN23 is connected to the ground reference voltage (VSS) and a drain terminal of the NMOS transistor MN23 is connected to the channel line 120. The transistor MN23 may be embodied as an open-drain type transistor, which may electrically isolate the second transmitter 154 from the memory controller supply voltage VDD2.

As shown in FIG. 2, the supply voltage for the first and second transmitters 102 and 154 (i.e., terminal voltage VTER) is independent of the memory supply voltage VDD1 and the memory controller supply voltage VDD2. Consequently, the first transmitter 102 operates independent from the memory controller supply voltage VDD2 and the second transmitter 154 operates independent from the memory supply voltage VDD1.

Exemplary operations of the interface system between the memory 100 and the memory controller 150, in accordance with embodiments of the present invention, will be described hereafter with reference to FIG. 2. Operations in which the memory controller 150 writes a logic "1" to the memory 100 will be described first. The NMOS transistor MN23 is turned on in response to the WRITE DATA driving the gate terminal to a high (i.e., logic "1") level and the drain terminal being driven to a low (i.e., logic "0") level corresponding to VSS. Consequently, the voltage on the channel line 120 is driven to a logic "0" level. The differential amplifier 22 amplifies the difference between the reference voltage VREF and the ground reference voltage VSS at its input terminals IN1 and IN2, respectively, and outputs the result as a logic "1" to be written into the memory cell array 106.

Operations in which the memory controller 150 writes a logic "0" to the memory 100 will now be described. The NMOS transistor MN23 is turned off in response to the WRITE DATA driving the gate terminal to a low (i.e., logic "0") level and the drain terminal being driven to a high (i.e., logic "1") level corresponding to VTER. Consequently, the voltage on the channel line 120 is driven to a logic "1" level corresponding to VTER. The differential amplifier 22 amplifies the difference between the reference voltage VREF and the terminal voltage VTER at its input terminals IN1 and IN2, respectively, and outputs the result as a logic "0" to be written into the memory cell array 106. Operations in which data are read from the memory 100 and are transmitted to the memory controller 150 are similar to the write operations described hereinabove.

Recall that the terminal voltage VTER is independent of both the memory supply voltage VDD1 and the memory controller supply voltage VDD2. Thus, the magnitude of the terminal voltage VTER may be increased to a suitable level regardless of the magnitudes of the memory supply voltage VDD1 and the memory controller supply voltage VDD2. When the magnitude of the terminal voltage VTER is larger than the respective magnitudes of the memory supply voltage VDD1 and the memory controller supply voltage VDD2, the magnitude of the data signal voltage that is transmitted as a logic "1" on the channel lines 110 and 120 is also larger than the respective magnitudes of the memory supply voltage VDD1 and the memory controller supply voltage VDD2. As the magnitude of the data signal voltage increases relative to the supply voltages VDD1 and VDD2, the effects of noise on the channels lines 110 and 120 may decrease, thereby improving the signal to noise ratio. In other words, memory interface systems, in accordance with embodiments of the present invention, may exhibit improved performance in the presence of channel noise.

Figure 3:
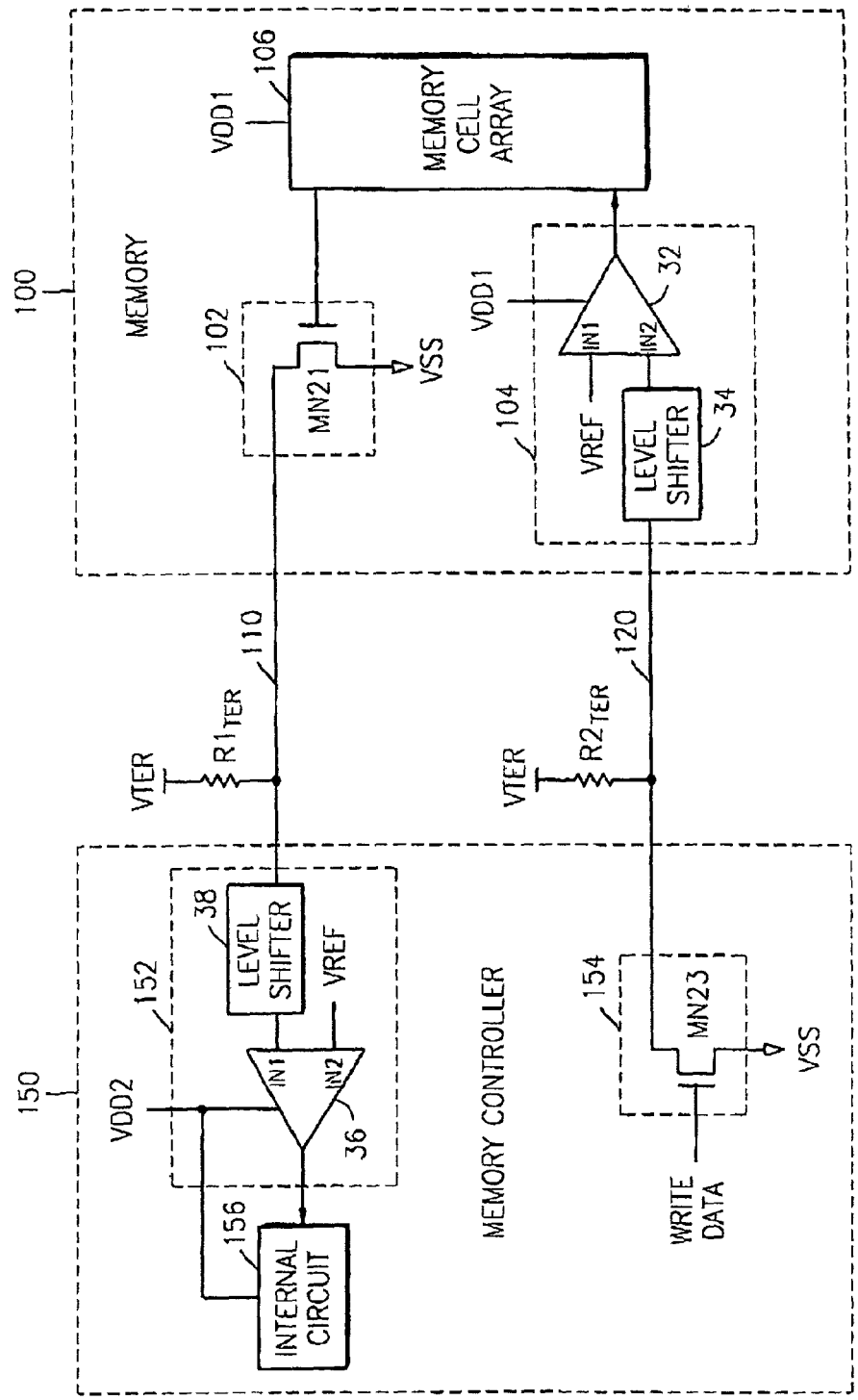

FIG. 3 illustrates a memory interface system in accordance with still further embodiments of the present invention. As shown in FIG. 3, the first receiver 104 comprises a level shifter 34 and a differential amplifier 32. The level shifter 34 shifts the channel signal voltage of the channel line 120 to a predetermined level and applies the shifted result to the second input terminal IN2 of the differential amplifier 32. The internal circuitry of the level shifter 34 may be implemented so that the output of the level shifter 34 is equal to the memory supply voltage VDD1 when a logic "1" signal corresponding to the terminal voltage VTER is transmitted on the channel line 120.

Still referring to FIG. 3, the second receiver 152 comprises a level shifter 38 and a differential amplifier 36. The level shifter 38 shifts the channel signal voltage of the channel line 110 to a predetermined level and applies the shifted result to the first input terminal IN1 of the differential amplifier 36. The internal circuitry of the level shifter 38 may be implemented so that the output of the level shifter 38 is equal to the memory controller supply voltage VDD2 when a logic "1" signal corresponding to the terminal voltage VTER is transmitted on the channel line 110.

In accordance with embodiments of the present invention, level shifters 34 and 38 may be used to reduce voltage stress, which may be generated when the magnitude of the terminal voltage VTER is larger than the respective magnitudes of the supply voltages VDD1 and/or VDD2. When the magnitude of the terminal voltage VTER is larger than the respective magnitudes of the supply voltages VDD1 and/or VDD2, excess electrical stress may be generated at the input terminals of the receivers 104 and/or 152, which may be designed based on the respective magnitudes of the supply voltages VDD1 and/or VDD2. Because there is typically little difference between the magnitudes of the supply voltages VDD1 and VDD2 and the terminal voltage VTER, operations of the receivers 104 and 152 is generally not impaired due to electrical stress. Nevertheless, to further increase reliability, the first receiver 104 may comprise the level shifter 34 so that logic "1" data transmitted on the channel line 120 may be level shifted to a voltage level corresponding to the memory supply voltage VDD1. Similarly, the second receiver 152 may comprise the level shifter 38 so that logic "1" data transmitted on the channel line 110 may be level shifted to a voltage level corresponding to the memory controller supply voltage VDD2. Level shifters 34 and 38 may be provided to compensate for the difference between the respective magnitudes of the supply voltages VDD1 and/or VDD2 and the terminal voltage VTER.

Operations for transmitting and receiving data using memory interface system embodiments in accordance with FIG. 3 are similar to those discussed hereinabove with respect to FIG. 2; therefore, a detailed description will be omitted. The magnitude of the data signal applied to the input terminal IN2 of the differential amplifier 32 and the magnitude of the data signal applied to the input terminal IN1 of the differential amplifier 36 for transmission of a logic "1" do not correspond to the terminal voltage VTER, however, but instead correspond to a level shifted voltage that is output from the level shifter circuits 34 and 38, respectively.

In accordance with embodiments of the present invention, because the supply voltages of a memory and a memory controller are electrically independent from each other and are also electrically independent from a terminal voltage, a computer system comprising the memory and the memory controller may be designed with fewer restrictions in setting supply voltages. Moreover, because the voltages that power the transmitters and receivers of the memory and the memory controller need not be uniformly adjusted, manufacturing costs may be reduced.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A memory interface system, comprising:
    at least one channel line that couples a memory to a memory controller, the at least one channel line being responsive to a terminal voltage that is independent of a memory supply voltage and a memory controller supply voltage;
    wherein the memory comprises a first transmitter and a first receiver, the memory controller comprises a second transmitter and a second receiver, and the at least one channel line comprises a first channel line that couples the first transmitter to the second receiver and a second channel line that couples the second transmitter to the first receiver; and
    wherein the first and second receivers are powered by the memory supply voltage and the memory controller supply voltage, respectively.

2. The memory interface system of claim 1, wherein the first and second transmitters are operable independent from the memory supply voltage and the memory controller supply voltage, respectively.

3. The memory interface system of claim 1, further comprising:
    a first level shifter circuit that couples the second channel line to the first receiver; and a second level shifter circuit that couples the first channel line to the second receiver.

4. The memory interface system of claim 1, wherein the first and second transmitters respectively comprise first and second open-drain MOS transistors.

5. The memory interface system of claim 2, wherein the first and second receivers respectively comprise first and second differential amplifier circuits.

6. The memory interface system of claim 5, wherein the first differential amplifier circuit is responsive to a first reference voltage and a data signal carried on the second channel line, and wherein the second differential amplifier circuit is responsive to a second reference voltage and a data signal carried on the first channel line.

7. The memory interface system of claim 5, further comprising:
    a first level shifter circuit that couples the second channel line to the first differential amplifier circuit; and
    a second level shifter circuit that couples the first channel line to the second differential amplifier circuit.

8. The memory interface system of claim 1, wherein a magnitude of the terminal voltage is greater than magnitudes of the memory supply voltage and the controller supply voltage, respectively.

9. A data processing system, comprising:
    a memory that is responsive to a memory supply voltage;
    a memory controller that is responsive to a memory controller supply voltage; and at least one channel line that couples the memory to the memory controller, the at least one channel line being responsive to a terminal voltage that is independent of the memory supply voltage and the memory controller supply voltage;
    wherein the memory comprises a first transmitter and a first receiver, the memory controller comprises a second transmitter and a second receiver, and the at least one channel line comprises a first channel line that couples the first transmitter to the second receiver and a second channel line that couples the second transmitter to the first receiver; and
    wherein the first and second receivers are powered by the memory supply voltage and the memory controller supply voltage, respectively.

10. The data processing system of claim 1, wherein the first and second transmitters are operable independent from the memory supply voltage and the memory controller supply voltage, respectively.

11. The data processing system of claim 1, further comprising:
    a first level shifter circuit that couples the second channel line to the first receiver; and
    a second level shifter circuit that couples the first channel line to the second receiver.

12. The data processing system of claim 1, wherein the first and second transmitters respectively comprise first and second open-drain MOS transistors.

13. The data processing system of claim 1, wherein the first and second receivers respectively comprise first and second differential amplifier circuits.

14. The data processing system of claim 13, wherein the first differential amplifier circuit is responsive to a first reference voltage and a data signal carried on the second channel line, and wherein the second differential amplifier circuit is responsive to a second reference voltage and a data signal carried on the first channel line.

15. The data processing system of claim 13, further comprising:
    a first level shifter circuit that couples the second channel line to the first differential amplifier circuit; and
    a second level shifter circuit that couples the first channel line to the second differential amplifier circuit.

16. The data processing system of claim 1, wherein a magnitude of the terminal voltage is greater than magnitudes of the memory supply voltage and the controller supply voltage, respectively.

* * * * *

UNITED STATES PATENT AND TRADEMARK OFFICE
CERTIFICATE OF CORRECTION

PATENT NO. : 7,334,137 B2  Page 1 of 1
APPLICATION NO. : 09/851277
DATED : February 19, 2008
INVENTOR(S) : Jung et al.

It is certified that error appears in the above-identified patent and that said Letters Patent is hereby corrected as shown below:

Column 7, Claim 5, Line 43:   Please correct "claim 2"
                              To read -- claim 1 --

Column 8, Claim 10, Line 23:  Please correct "claim 1"
                              To read -- claim 9 --

Column 8, Claim 11, Line 27:  Please correct "claim 1"
                              To read -- claim 9 --

Column 8, Claim 12, Line 33:  Please correct "claim 1"
                              To read -- claim 9 --

Column 8, Claim 13, Line 36:  Please correct "claim 1"
                              To read -- claim 9 --

Column 8, Claim 16, Line 52:  Please correct "claim 1"
                              To read -- claim 9 --

Signed and Sealed this

Fifteenth Day of July, 2008

JON W. DUDAS
*Director of the United States Patent and Trademark Office*